United States Patent
Kusano et al.

(10) Patent No.: US 10,854,792 B2
(45) Date of Patent: Dec. 1, 2020

(54) LIGHT-EMITTING DEVICE AND ILLUMINATION APPARATUS

(71) Applicant: KYOCERA Corporation, Kyoto (JP)

(72) Inventors: Tamio Kusano, Higashi-omi (JP); Daisuke Sakumoto, Omi-hachiman (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/626,981

(22) PCT Filed: Jun. 25, 2018

(86) PCT No.: PCT/JP2018/023997
§ 371 (c)(1),
(2) Date: Dec. 27, 2019

(87) PCT Pub. No.: WO2019/004119
PCT Pub. Date: Jan. 3, 2019

(65) Prior Publication Data
US 2020/0135986 A1    Apr. 30, 2020

(30) Foreign Application Priority Data

Jun. 28, 2017 (JP) .................................. 2017-126561

(51) Int. Cl.
*H01L 33/50* (2010.01)
*H01L 25/13* (2006.01)
(Continued)

(52) U.S. Cl.
CPC ............. *H01L 33/504* (2013.01); *F21V 3/08* (2018.02); *F21V 3/12* (2018.02); *F21V 9/38* (2018.02);
(Continued)

(58) Field of Classification Search
CPC . H01L 33/504; F21V 1/17; F21V 3/08; F21V 3/12; F21V 5/10; F21V 7/26; F21V 7/30; F21V 9/30; F21V 9/32; F21V 9/38
See application file for complete search history.

(56) References Cited

U.S. PATENT DOCUMENTS

| | | | | |
|---|---|---|---|---|
| 2012/0019127 A1* | 1/2012 | Hirosaki | ............ | C09K 11/7715 313/503 |
| 2015/0153010 A1* | 6/2015 | Okuyama | ................. | F21V 9/38 362/510 |

(Continued)

FOREIGN PATENT DOCUMENTS

JP    2015-126160 A    7/2015

*Primary Examiner* — Sean P Gramling
(74) *Attorney, Agent, or Firm* — Volpe Koenig (57) ABSTRACT

A light-emitting device includes a wavelength conversion member including, in a dispersed manner, a first phosphor, a second phosphor, a third phosphor, a fourth phosphor, and a fifth phosphor, and a light emitter. The first phosphor has a peak in a wavelength region of 400 to 500 nm, the second phosphor in 450 to 550 nm, the third phosphor in 500 to 600 nm, the fourth phosphor in 600 to 700 nm, and a fifth phosphor in 680 to 800 nm. The light emitter emits light in an ultraviolet region of 380 to 430 nm. The light-emitting device has an emission spectrum in a region of 380 to 950 nm including peaks in regions of 380 to 430 nm, 430 to 480 nm, 480 to 550 nm, 550 to 650 nm, and 650 to 750 nm, and differences between relative light intensities at the peaks are less than 20%.

7 Claims, 11 Drawing Sheets

(51) Int. Cl.
- *F21V 3/12* (2018.01)
- *F21V 3/08* (2018.01)
- *F21V 9/38* (2018.01)
- *F21V 29/70* (2015.01)
- *F21Y 103/10* (2016.01)
- *F21Y 115/10* (2016.01)

(52) U.S. Cl.
CPC .............. *H01L 25/13* (2013.01); *F21V 29/70* (2015.01); *F21Y 2103/10* (2016.08); *F21Y 2115/10* (2016.08)

(56) References Cited

U.S. PATENT DOCUMENTS

2017/0179347 A1\* 6/2017 Asai .................. C09K 11/617
2017/0345976 A1\* 11/2017 Asai .................. C09K 11/7739

\* cited by examiner

LIGHT-EMITTING DEVICE AND ILLUMINATION APPARATUS

FIELD

The present invention relates to a light-emitting device including a light-emitting diode (LED), and to an illumination apparatus.

BACKGROUND

Illumination apparatuses including semiconductor light emitters such as LEDs as light sources, instead of fluorescent or incandescent lamps, have been used recently. For example, an illumination apparatus including a light emitter is used as a light source for visual inspection of painted surfaces of products, such as home electric appliances and automobiles.

A semiconductor light emitter emits light with a narrow region of wavelengths, and simply emits monochromatic light. To produce white light as illumination light, a plurality of semiconductor light emitters that emit light in different wavelength regions are prepared, and a plurality of light beams with different colors emitted from such semiconductor light emitters are mixed to produce white light. In some cases, a plurality of phosphors that emit light in different wavelength regions using excitation light with the same wavelength are prepared, and light emitted from a semiconductor light emitter and a plurality of fluorescence beams, which are excited by the light from the semiconductor light emitter, with different colors are mixed into white light. This method of mixing colors allows production of a light source that emits white light or that emits light with another spectrum for intended use (refer to Japanese Unexamined Patent Application Publication No. 2015-126160).

However, the technique described in Japanese Unexamined Patent Application Publication No. 2015-126160 may cause illuminated surfaces to appear differently when illuminated with white light and when observed with sunlight.

BRIEF SUMMARY

A light-emitting device according to one aspect of the present invention includes a wavelength conversion member and a light emitter. The wavelength conversion member includes a first phosphor, a second phosphor, a third phosphor, a fourth phosphor, and a fifth phosphor. The first phosphor emits fluorescence having a first peak wavelength in a wavelength region of 400 to 500 nm. The second phosphor emits fluorescence having a second peak wavelength in a wavelength region of 450 to 550 nm. The third phosphor emits fluorescence having a third peak wavelength in a wavelength region of 500 to 600 nm. The fourth phosphor emits fluorescence having a fourth peak wavelength in a wavelength region of 600 to 700 nm. The fifth phosphor emits fluorescence having a fifth peak wavelength in a wavelength region of 680 to 800 nm and a sixth peak wavelength longer than the fifth peak wavelength in a wavelength region of 700 to 800 nm. The light emitter emits light having a seventh peak wavelength in a wavelength region of 380 to 430 nm. The light-emitting device has an emission spectrum in a wavelength region of 380 to 950 nm including an eighth peak wavelength in a wavelength region of 380 to 430 nm, a ninth peak wavelength in a wavelength region of 430 to 480 nm, a tenth peak wavelength in a wavelength region of 480 to 550 nm, an eleventh peak wavelength in a wavelength region of 550 to 650 nm, a twelfth peak wavelength and a thirteenth peak wavelength in a wavelength region of 650 to 750 nm, and differences between relative light intensities at the peak wavelengths are less than 20%.

An illumination apparatus according to another aspect of the present invention includes a plurality of the above light-emitting devices.

DETAILED DESCRIPTION

A light-emitting device and an illumination apparatus according to one or more embodiments of the present invention will now be described with reference to the drawings.

Structure of Light-Emitting Device

Figure 1:
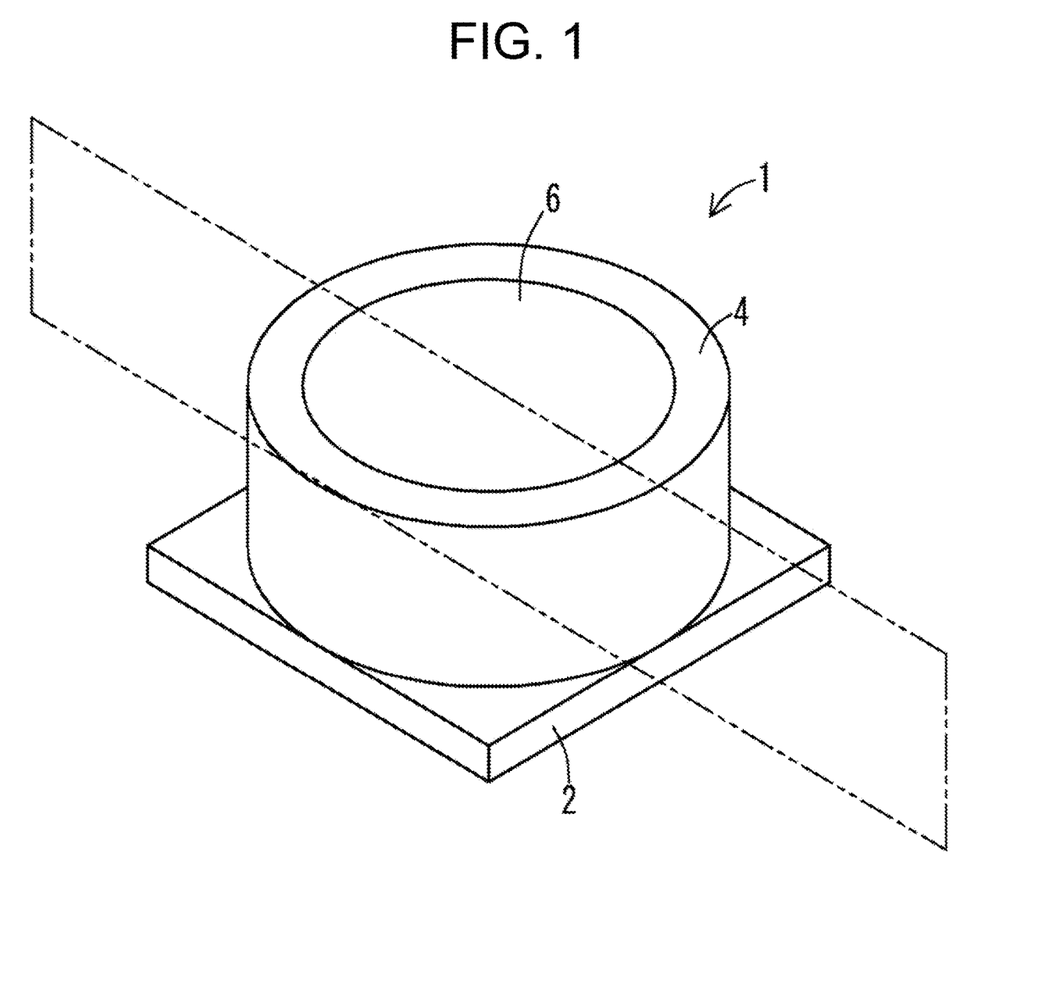
FIG. 1 is an external perspective view of a light-emitting device according to one embodiment of the present invention.
Figure 2:
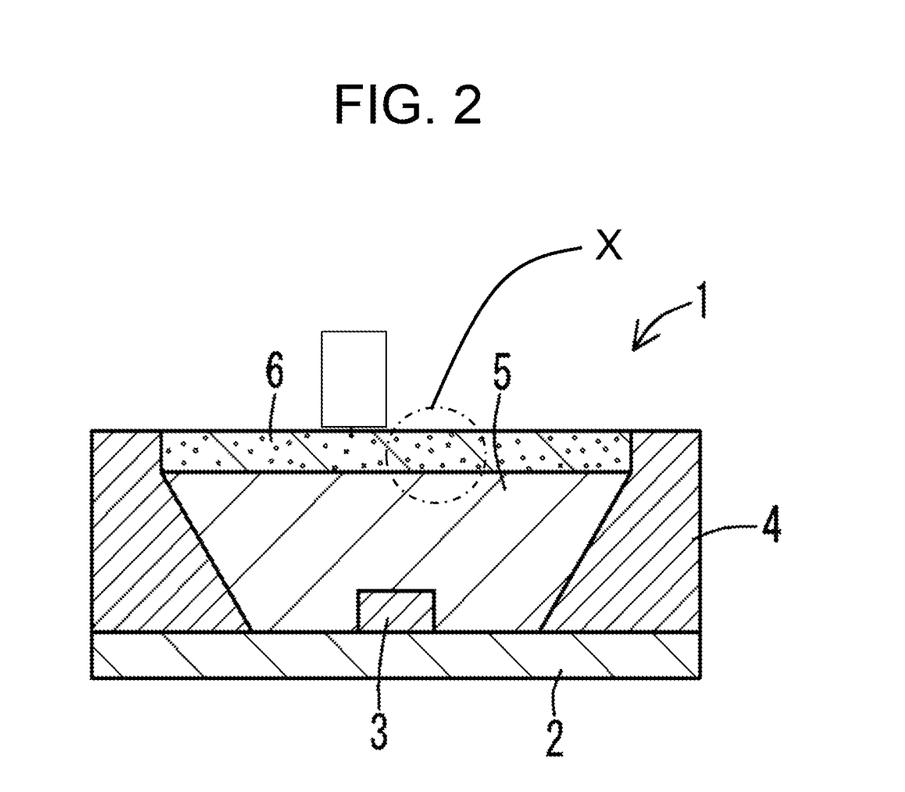
FIG. 2 is a cross-sectional view of the light-emitting device taken along a plane indicated by an imaginary line shown in FIG. 1.
Figure 3:
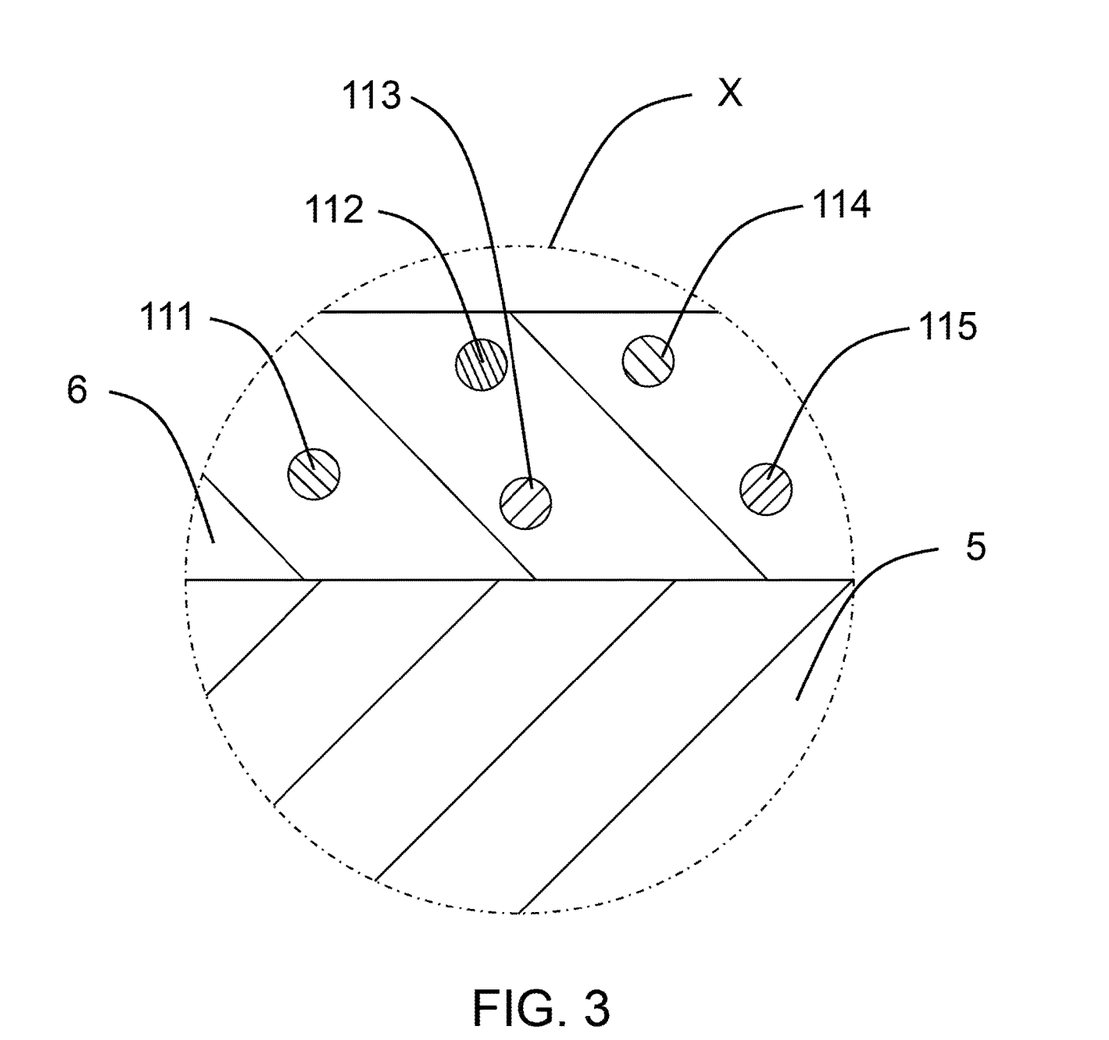
FIG. 3 is an enlarged view of the light-emitting device shown in FIG. 2.
Figure 4:
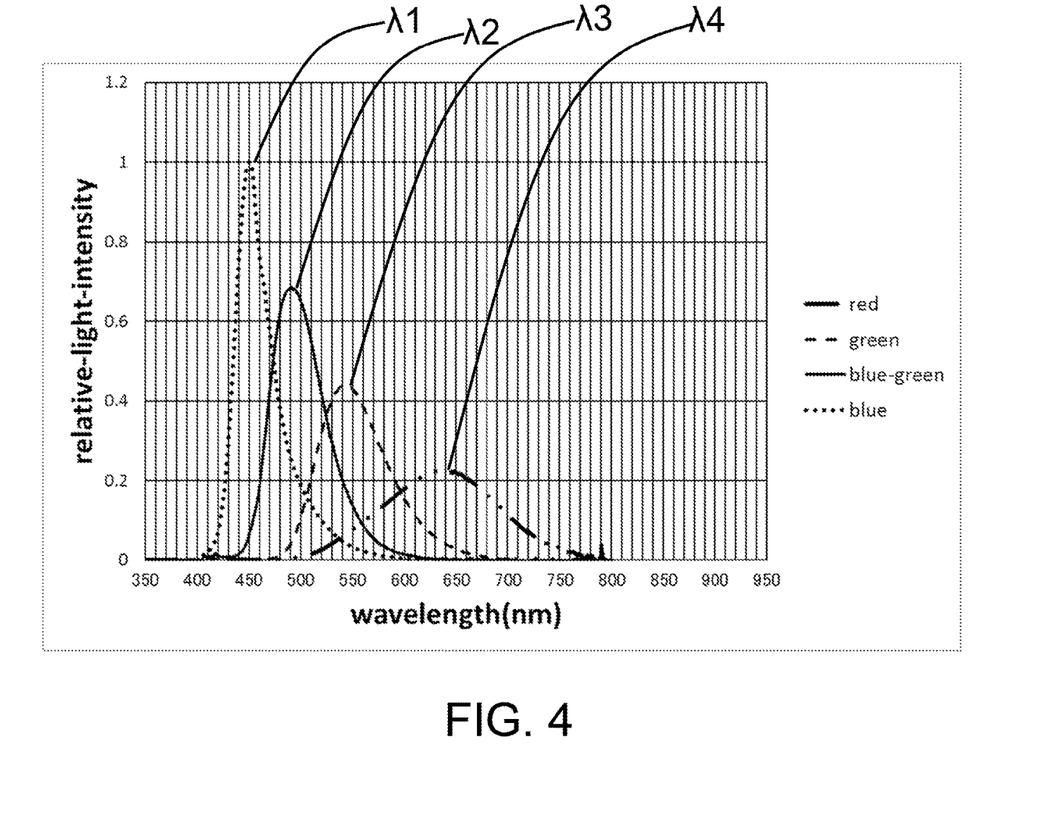
FIG. 4 is a graph showing example fluorescence spectra of a first phosphor, a second phosphor, a third phosphor, and a fourth phosphor included in phosphors used for the light-emitting device according to the embodiment.
Figure 5:
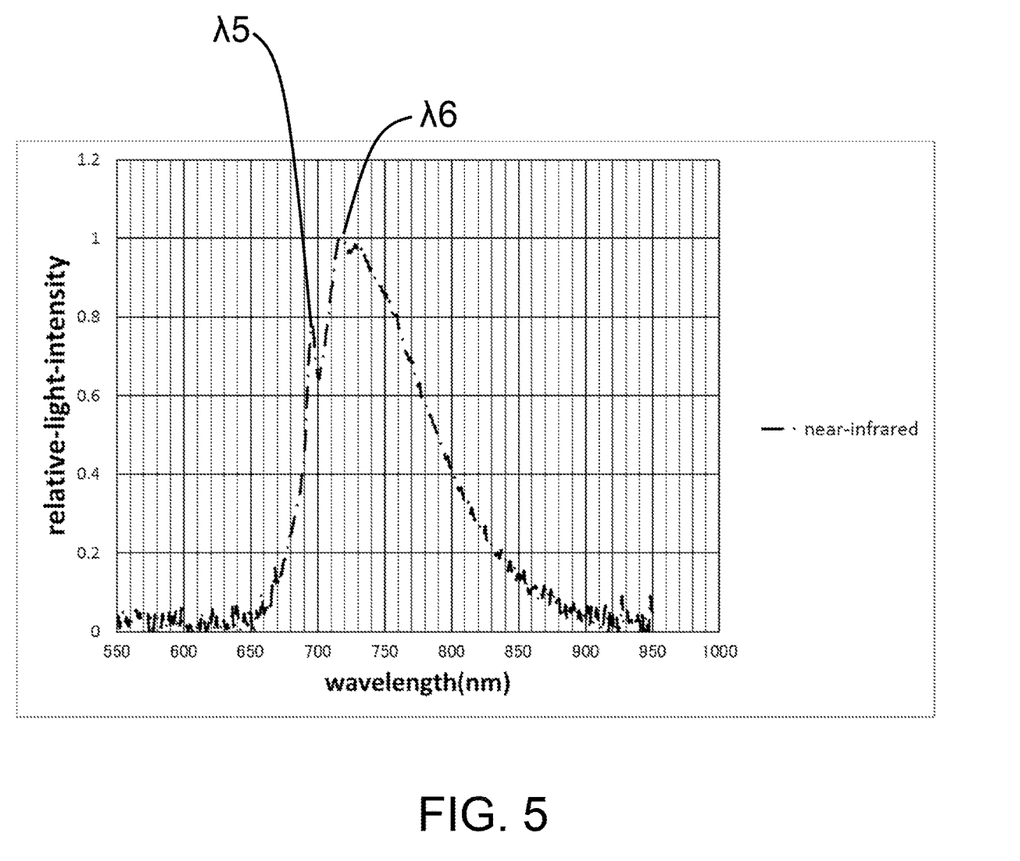
FIG. 5 is a graph showing an example fluorescence spectrum of the fifth phosphor included in the phosphors used for the light-emitting device according to the embodiment.
Figure 6:
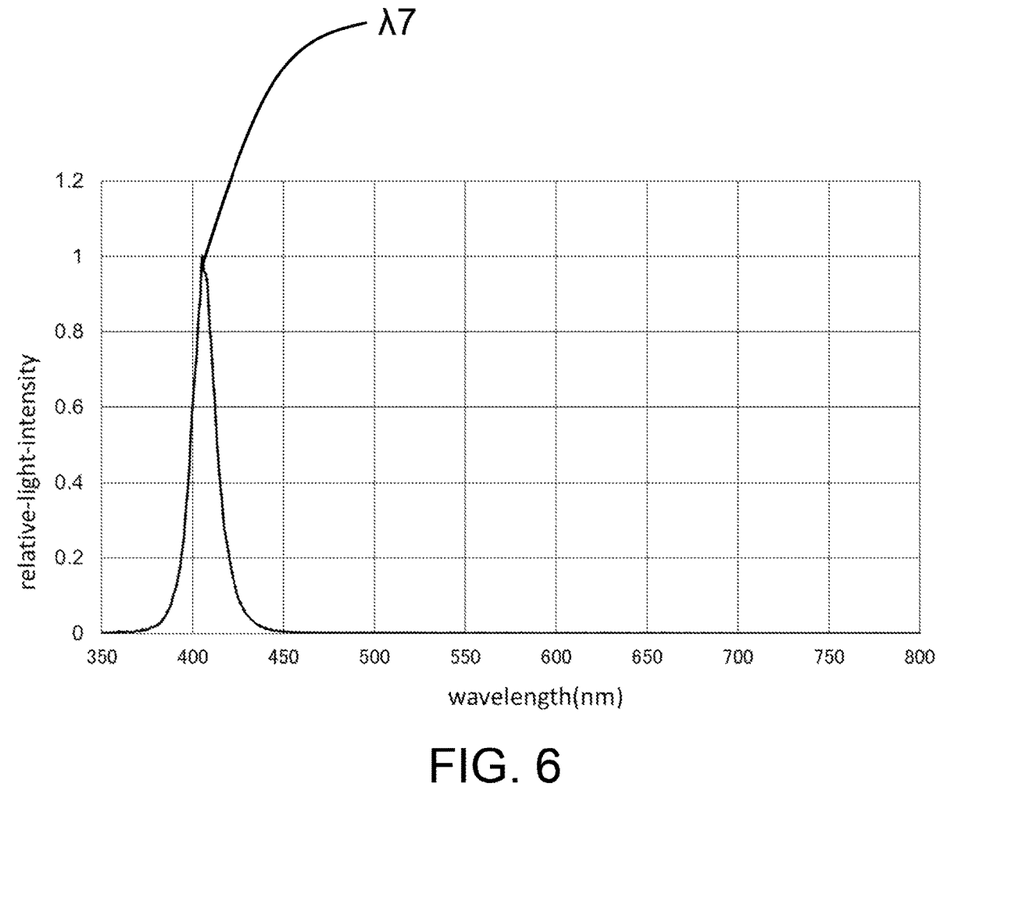
FIG. 6 is a graph showing an example emission spectrum of excitation light emitted from a light emitter included in the light-emitting device according to the embodiment.
Figure 7:
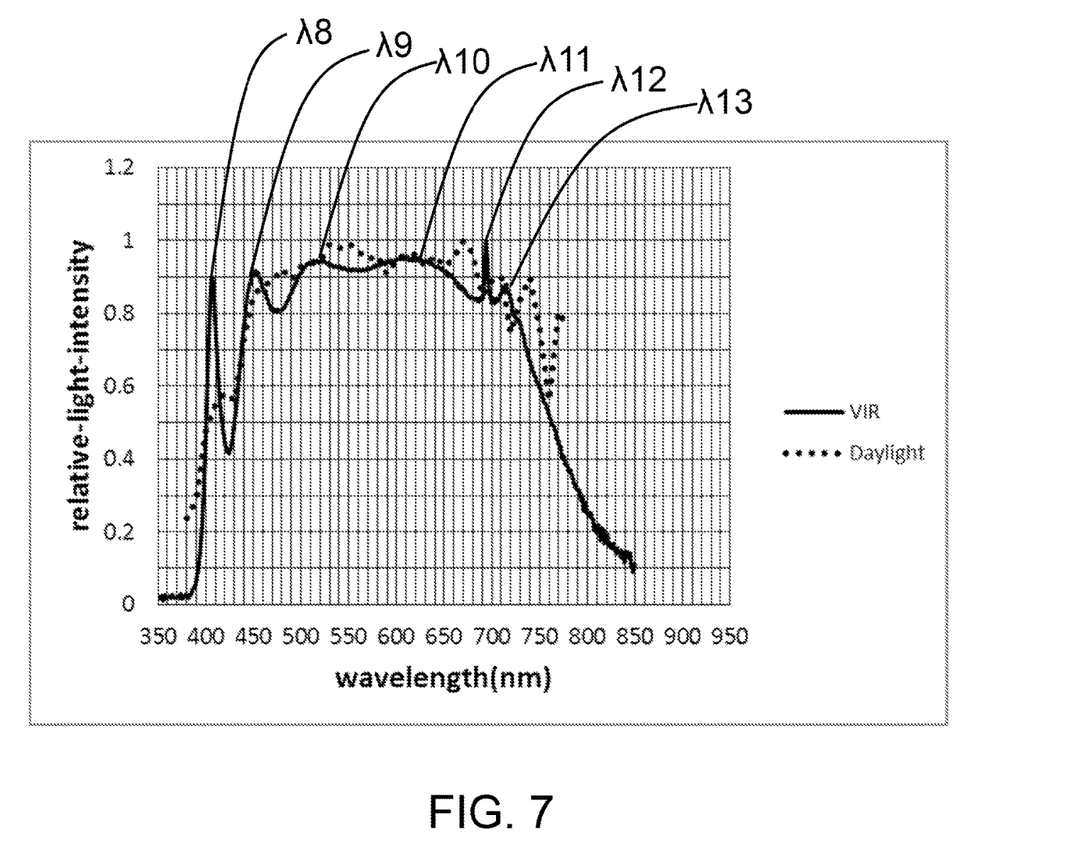
FIG. 7 is a graph showing an emission spectrum of the light emitter according to one embodiment of the present invention.

FIG. 1 is an external perspective view of a light-emitting device according to one embodiment of the present invention. FIG. 2 is a cross-sectional view of the light-emitting device taken along a plane indicated by an imaginary line shown in FIG. 1. FIG. 3 is an enlarged view of the light-emitting device shown in FIG. 2. FIG. 4 is a graph showing example fluorescence spectra of a first phosphor, a second phosphor, a third phosphor, and a fourth phosphor included in phosphors used for the light-emitting device according to the embodiment. FIG. 5 is a graph showing an example fluorescence spectrum of the fifth phosphor included in the phosphors used for the light-emitting device according to the embodiment. FIG. 6 is a graph showing an example emission spectrum of excitation light emitted from a light emitter included in the light-emitting device according to the embodiment. FIG. 7 is a graph showing an emission spectrum of the light emitter according to one embodiment of the present invention. As shown in these figures, a light-emitting device 1 includes a substrate 2, a light emitter 3, a frame 4, a sealant 5, and a wavelength conversion member 6.

The light-emitting device 1 includes the substrate 2, the light emitter 3 located on the substrate 2, the frame 4 located on the substrate 2 to surround the light emitter 3, the sealant 5 filling an inner space defined by the frame 4 except an upper area of the inner space defined by the frame 4, and the wavelength conversion member 6 placed on the upper surface of the sealant 5 in the upper area of the inner space defined by the frame 4 to fit inside the frame 4. The light emitter 3 is, for example, a light-emitting diode (LED), and emits light outwardly when electrons and holes in the p-n junction in semiconductors are recombined.

The substrate 2 is an insulating substrate, and is formed from, for example, a ceramic material such as alumina or mullite, or a glass ceramic material. In some embodiments, the substrate 2 may be formed from a composite material containing two or more of these materials. The substrate 2 may contain a polymeric resin in which metallic oxide particles are dispersed to adjust the thermal expansion of the substrate 2.

The substrate 2 has, on at least its main surface or its inside, a wiring conductor that provides electrical connection inside and outside the substrate 2. The wiring conductor is formed from, for example, a conductive material such as tungsten, molybdenum, manganese, or copper. The substrate 2 formed from a ceramic material may be prepared by, for example, applying a metal paste containing powder of, for example, tungsten containing an organic solvent in a predetermined pattern of a ceramic green sheet, which is to be the substrate 2, by printing, stacking a plurality of ceramic green sheets prepared in this manner on one another, and firing the structure. This completes the substrate 2. The surface of the wiring conductor is plated with, for example, nickel or gold for preventing oxidation. The upper surface of the substrate 2 may be coated with a metallic reflective layer that is formed from, for example, aluminum, silver, gold, copper, or platina, and is spaced from the wiring conductor and the plating layer to efficiently reflect light upward from the substrate 2.

The light emitter 3 is mounted on the main surface of the substrate 2. The light emitter 3 is electrically connected on the plating layer on the surface of the wiring conductor on the main surface of the substrate 2 with, for example, brazing material or solder. The light emitter 3 includes a translucent base and an optical semiconductor layer formed on the translucent base. The translucent base allows an optical semiconductor layer to be deposited by chemical vapor deposition, such as metal organic chemical vapor deposition or molecular beam epitaxy. The translucent base may be formed from, for example, sapphire, gallium nitride, aluminum nitride, zinc oxide, zinc selenide, silicon carbide, silicon, or zirconium boride. The translucent base has a thickness of, for example, 50 to 1000 µm inclusive.

The optical semiconductor layer includes a first semiconductor layer formed on the translucent base, a light-emitting layer formed on the first semiconductor layer, and a second semiconductor layer formed on the light-emitting layer. The first semiconductor layer, the light-emitting layer, and the second semiconductor layer may be formed from, for example, a group III nitride semiconductor, a group III-V semiconductor such as gallium phosphide or gallium arsenide, or a group III nitride semiconductor such as gallium nitride, aluminum nitride, or indium nitride. The first semiconductor layer has a thickness of, for example, 1 to 5 µm inclusive. The light-emitting layer has a thickness of, for example, 25 to 150 nm inclusive. The second semiconductor layer has a thickness of, for example, 50 to 600 nm inclusive. The light emitter 3 formed in this manner may emit excitation light with a wavelength range of, for example, 370 to 420 nm inclusive.

The frame 4 is formed from a resin material that is a mixture of powders of, for example, a ceramic material such as aluminum oxide, titanium oxide, zirconium oxide, or yttrium oxide, a porous material, or a metallic oxide such as aluminum oxide, titanium oxide, zirconium oxide, or yttrium oxide. The frame 4 is bonded to the main surface of the substrate 2 with, for example, a resin, brazing material, or solder. The frame 4 is spaced from the light emitter 3 on the main surface of the substrate 2 to surround the light emitter 3. The frame 4 has an inner sloping wall that flares away from the main surface of the substrate 2. The inner wall of the frame 4 serves as a reflection surface for reflecting excitation light emitted from the light emitter 3. When the inner wall of the frame 4 is circular as viewed from above, the reflection surface can uniformly reflect light emitted from the light emitter 3 outwardly.

The sloping inner wall of the frame 4 may have, for example, a metallic layer of tungsten, molybdenum, or manganese formed on the inner periphery of the frame 4 formed from a sintered material, and a plating layer of nickel or gold covering the metallic layer. The plating layer reflects light emitted from the light emitter 3. The inner wall of the frame 4 may have a slope angle of, for example, 55 to 70° inclusive with respect to the main surface of the substrate 2.

The inner space defined by the substrate 2 and the frame 4 is filled with the sealant 5, which transmits light. The sealant 5, which seals the light emitter 3, receives light emitted from inside the light emitter 3. Further, the sealant 5 can transmit the light received from the light emitter 3. The sealant 5 fills the inner space defined by the substrate 2 and the frame 4 except an area of the inner space defined by the frame 4. The sealant 5 may be, for example, a translucent insulating resin such as a silicone resin, an acrylic resin, or an epoxy resin, or translucent glass. The sealant 5 has a refractive index of, for example, 1.4 to 1.6 inclusive.

The wavelength conversion member 6 is placed on the upper surface of the sealant 5 in the upper area of the inner space defined by the substrate 2 and the frame 4. The wavelength conversion member 6 is sized to fit inside the frame 4. The wavelength conversion member 6 converts the wavelength of light emitted from the light emitter 3. More specifically, the wavelength conversion member 6 receives light emitted from the light emitter 3 through the sealant 5. The light emitted from the light emitter 3 and incident on the wavelength conversion member 6 excites phosphors in the wavelength conversion member 6, which then emit fluorescence. The wavelength conversion member 6 emits light by transmitting part of the light emitted from the light emitter 3. The wavelength conversion member 6 is formed from, for example, a translucent insulating resin such as a fluororesin, a silicone resin, an acrylic resin, or an epoxy resin, or translucent glass. The insulating resin or the glass contains phosphors. The phosphors are uniformly dispersed in the wavelength conversion member 6.

The light emitter 3 and the phosphors contained in the wavelength conversion member 6 are selected to obtain the light-emitting device 1 that emits light with an emission spectrum shown in FIG. 7.

The light-emitting device 1 according to the present embodiment includes the light emitter 3 having a seventh peak wavelength λ7 in the region of 380 to 430 nm, and the phosphors including a first phosphor 111 that emits blue fluorescence with a first peak wavelength λ1, a second phosphor 112 that emits blue-green fluorescence with a second peak wavelength λ2, a third phosphor 113 that emits green fluorescence with a third peak wavelength λ3, a fourth phosphor 114 that emits red fluorescence with a fourth peak wavelength λ4, and a fifth phosphor 115 that emit fluorescence in the near-infrared region with a fifth peak wavelength λ5 and a sixth peak wavelength λ6 having different light intensities. Blue fluorescence has a first peak wavelength λ1 in a wavelength region of 400 to 500 nm, blue-green fluorescence has a second peak wavelength λ2 in a wavelength region of 450 to 550 nm, green fluorescence has a third peak wavelength λ3 in a wavelength region of 500 to 600 nm, red fluorescence has a fourth peak wavelength λ4 in a wavelength region of 600 to 700 nm, and fluorescence in the near-infrared region has a fifth peak wavelength λ5 and a sixth peak wavelength λ6 in a wavelength region of 680 to 800 nm. Although the near-infrared region corresponds to the wavelength region of 680 to 2500 nm, the near-infrared region for the light-emitting device 1 according to the embodiment of the present invention has the peak wavelength in the above specified range.

For example, the first phosphor 111 showing blue is $BaMgAl_{10}O_{17}$:Eu, $(Sr, Ca, Ba)_{10}(PO_4)_6C_{12}$:Eu, or $(Sr, Ba)_{10}(PO_4)_6Cl_2$:Eu, and the second phosphor 112 showing blue-green is $(Sr, Ba, Ca)_5(PO_4)_3Cl$:Eu or $Sr_4Al_{14}O_{25}$:Eu. The third phosphor 113 showing green is $SrSi_2(O, Cl)_2N_2$:Eu, $(Sr, Ba, Mg)_2SiO_4$:Eu$^{2+}$, ZnS:Cu, Al, or $Zn_2SiO_4$:Mn. The fourth phosphor 114 showing red is $Y_2O_2S$:Eu, $Y_2O_3$:Eu, $SrCaClAlSiN_3$:Eu$^{2+}$, $CaAlSiN_3$:Eu, or $CaAlSi(ON)_3$:Eu. The fifth phosphor 115 showing fluorescence in the near-infrared region is $3Ga_5O_{12}$:Cr.

The light-emitting device 1 according to the embodiment of the present invention mixes, in its emission spectrum in the wavelength region of 380 to 950 nm, fluorescence emitted from the first phosphor 111, the second phosphor 112, the third phosphor 113, the fourth phosphor 114, and the fifth phosphor 115, and light emitted from the light emitter 3. The light-emitting device 1 thus emits light with an emission spectrum including an eighth peak wavelength λ8 in a wavelength region of 380 to 430 nm, a ninth peak wavelength λ9 in a wavelength region of 430 to 480 nm, a tenth peak wavelength λ10 in a wavelength region of 480 to 550 nm, an eleventh peak wavelength λ11 in a wavelength region of 550 to 650 nm, and a twelfth peak wavelength λ12 and a thirteenth peak wavelength λ13 in a wavelength region of 650 to 750 nm. The light-emitting device 1 according to the embodiment of the present invention has small differences between the relative light intensities at the eighth peak wavelength λ8, the ninth peak wavelength λ9, the tenth peak wavelength λ10, the eleventh peak wavelength λ11, the twelfth peak wavelength λ12, and the thirteenth peak wavelength λ13 plotted on the vertical axis in FIG. 7. As shown in FIG. 7, the relative light intensities at the eighth peak wavelength λ8 to the thirteenth peak wavelength λ13 differ from each other by less than 20%, or 0.2.

The light-emitting device 1 according to the embodiment of the present invention can thus reduce color variations in emitted light that may result from variations at peak wavelengths in fluorescence output from the first phosphor 111, the second phosphor 112, the third phosphor 113, the fourth phosphor 114, and the fifth phosphor 115 caused by variations in the temperature of each phosphor. More specifically, when, for example, one of the first phosphor 111, the second phosphor 112, the third phosphor 113, the fourth phosphor 114, and the fifth phosphor 115 outputs fluorescence that varies at the peak wavelength, the variation may be corrected using fluorescence from other phosphors. The light-emitting device 1 is thus more likely to retain the color of emitted light. The light-emitting device 1 according to the embodiment of the present invention can thus reduce color variations in emitted light resulting from variations in the intensities of fluorescence emitted from the phosphors at the peak wavelengths.

The light-emitting device 1 according to the embodiment of the present invention emits light with higher color rendering, enabling the spectrum more similar to the spectrum of sunlight. In other words, this structure reduces the difference between the relative intensities in the spectrum of sunlight and in the emission spectrum of the light-emitting device 1 according to the embodiment of the present invention. The resultant light-emitting device 1 has the emission spectrum similar to the spectrum of sunlight.

A light-emitting device 1 according to another embodiment of the present invention has a spectral distribution (an integral value of the emission spectrum indicating the light intensity) in the wavelength region of 380 to 430 nm to be 2 to 10% of the spectral distribution in the wavelength region of 380 to 950 nm. The light-emitting device 1 thus emits light having a seventh peak wavelength λ7 emitted from the light emitter 3, in addition to the fluorescence emitted from the first phosphor 111, the second phosphor 112, the third phosphor 113, the fourth phosphor 114, and the fifth phosphor 115. The light-emitting device 1 thus emits light having the spectrum similar to the spectrum of sunlight and having less color variations. More specifically, the light-emitting device 1 emits light having an emission spectrum in the wavelength region of 380 to 950 nm and having less color variations in emitted light resulting from variations in the intensity of light from any of the light emitter 3 or the phosphors, or in other words, variations in the relative light intensities plotted on the vertical axis in FIG. 7.

The light-emitting device 1 according to the other embodiment of the present invention has, in its emission spectrum, a difference between the highest light intensity and the lowest light intensity of 0.5 or less or 50% or less in terms of relative light intensity in a wavelength region between the eighth peak wavelength λ8 and the ninth peak wavelength λ9. This reduces the likelihood of blue light near the first peak wavelength λ1 having varying light intensities when the seventh peak wavelength λ7 of the light emitted from the light emitter 3 in the light-emitting device 1 shifts toward a longer wavelength (toward a blue region) as the temperature of the light emitter 3 increases. The light-emitting device 1 thus emits light having a spectrum similar to the spectrum of sunlight and having less color variations.

The light-emitting device 1 according to the other embodiment of the present invention has a spectral distribution in the wavelength region of 620 to 850 nm to be 35 to 45% of the spectral distribution in the wavelength region of 380 to 950 nm. The light-emitting device 1 thus emits light having a spectrum with more light in the red region and the near-infrared region similar to the spectrum of sunlight, while reducing the likelihood of emitted light having varying colors when activated. More specifically, at light intensities varying in the wavelength region of 380 to 620 nm, the light-emitting device 1 can easily retain red light when the spectral distribution in the wavelength region of 620 to 850 nm constitutes 35% or more of that in the wavelength region of 380 to 950 nm, and can easily prevent red light from becoming too reddish when the spectral distribution in the wavelength region of 620 to 850 nm constitutes 45% or less of that in the wavelength region of 380 to 950 nm. The light-emitting device 1 can thus reduce color variations in emitted light resulting from, for example, variations in the light intensity around a high luminosity of 550 nm.

The light-emitting device 1 according to the other embodiment of the present invention has, in its emission spectrum, a difference between the highest light intensity and the lowest light intensity of 20% or less in terms of relative light intensity in the wavelength region of 450 to 620 nm. The light-emitting device 1 can thus reduce the likelihood of emitted light having greatly varying colors. More specifically, when the light-emitting device 1 is activated, the phosphors may generate heat and their luminous efficacy may vary, causing varying intensities of fluorescence emitted from the phosphors. In the wavelength region of 450 to 620 nm, however, the light emitted from the light-emitting device 1 is less susceptible to the light intensity of a part of the wavelength region. The light-emitting device 1 can thus reduce color variations in emitted light although the light intensity of fluorescence emitted from each phosphor varies, and can efficiently emit light with higher color rendering, enabling the spectrum more similar to the spectrum of sunlight. In other words, the light-emitting device 1 has energy of light uniformly dispersed across the spectrum in the wavelength region of 450 to 620 nm, without having concentrated energy in a certain portion of the spectrum. The light-emitting device 1 thus efficiently emits light having less color variations and having higher color rendering, enabling the spectrum more similar to the spectrum of sunlight.

The light-emitting device 1 has a relative light intensity at the eighth peak wavelength $\lambda 8$ lower than the highest light intensity in its emission spectrum, and has a difference of 30% or less in terms of the relative light intensities. The light-emitting device 1 can thus reduce color variations in emitted light resulting from varying light intensities of light from the light emitter 3 or phosphors due to variations in their luminous efficacies caused by heat generated in the light emitter 3 or the phosphors when the light-emitting device 1 is activated. The light-emitting device 1 can further reduce the likelihood that the color of light from the light emitter 3 and light from the phosphors appear to be color irregularities on the surface illuminated by the light-emitting device 1.

The light-emitting device 1 according to the other embodiment of the present invention has the highest light intensity at the twelfth peak wavelength $\lambda 12$ in the emission spectrum shown in FIG. 7. The light-emitting device 1 can thus reduce the likelihood of variations in color rendering or in reproducibility of the red color of light emitted from the light-emitting device 1 resulting from varying intensities of fluorescence emitted from the first phosphor 111, the second phosphor 112, the third phosphor 113, and the fourth phosphor 114.

The light-emitting device 1 according to the other embodiment of the present invention may have the light intensity at the fifth peak wavelength $\lambda 5$ lower than the light intensity at the sixth peak wavelength $\lambda 6$ as shown in FIG. 5. More specifically, the light intensity of fluorescence at the peak in the region of 680 to 700 nm emitted from the fifth phosphor is lower than the light intensity of fluorescence at the peak in the wavelength region of 700 nm or higher. This reduces the likelihood of the light intensity of fluorescence becoming extremely higher than the light intensity in any other wavelength region in the wavelength region of 680 to 700 nm, in which the peak wavelengths of light emitted from the fourth phosphor and light emitted from the fifth phosphor may overlap with each other. In other words, the light-emitting device 1 can reduce the likelihood of the light intensity becoming excessively high at the twelfth peak wavelength $\lambda 12$ at which fluorescence from the fourth phosphor 114 and fluorescence from the fifth phosphor 115 are mixed.

FIG. 6 shows an example emission spectrum of light for exciting phosphors (hereafter, excitation light) emitted from the light emitter 3 included in the light-emitting device 1 according to the embodiment of the present invention. FIGS. 4 and 5 show example fluorescence spectra of the first phosphor 111, the second phosphor 112, the third phosphor 113, the fourth phosphor 114, and the fifth phosphor 115 included in the phosphors used for the light-emitting device 1 according to the embodiment. FIGS. 4 to 7 show spectra in terms of relative light intensity based on the highest light intensity of each spectrum expressed as 1. The emission spectrum and the fluorescence spectra shown in FIGS. 4 to 7 indicate relative light intensities based on actual measured values.

The light-emitting device 1 according to the embodiment of the present invention is used in an illumination apparatus for indoor use, such as in a building or in a house. In one example, a plurality of light-emitting devices 1 are arranged. In one example, an illumination apparatus for a living space including the light-emitting devices 1 placed indoors can create a lighting environment that simulates an environment illuminated with sunlight. In another example, an illumination apparatus for visual inspection of painted products, such as automobiles, including the light-emitting devices 1 placed indoors can create an inspection environment simulating an environment illuminated with sunlight. In color inspection, an inspection target illuminated indoors with light similar to sunlight can appear in colors similar to the colors under sunlight (with improved color rendering). The color inspection can be more accurate. An illumination apparatus including the light-emitting devices 1 according to the present embodiment will now be described with reference to the accompanying drawings.

Structure of Illumination Apparatus

Figure 8:
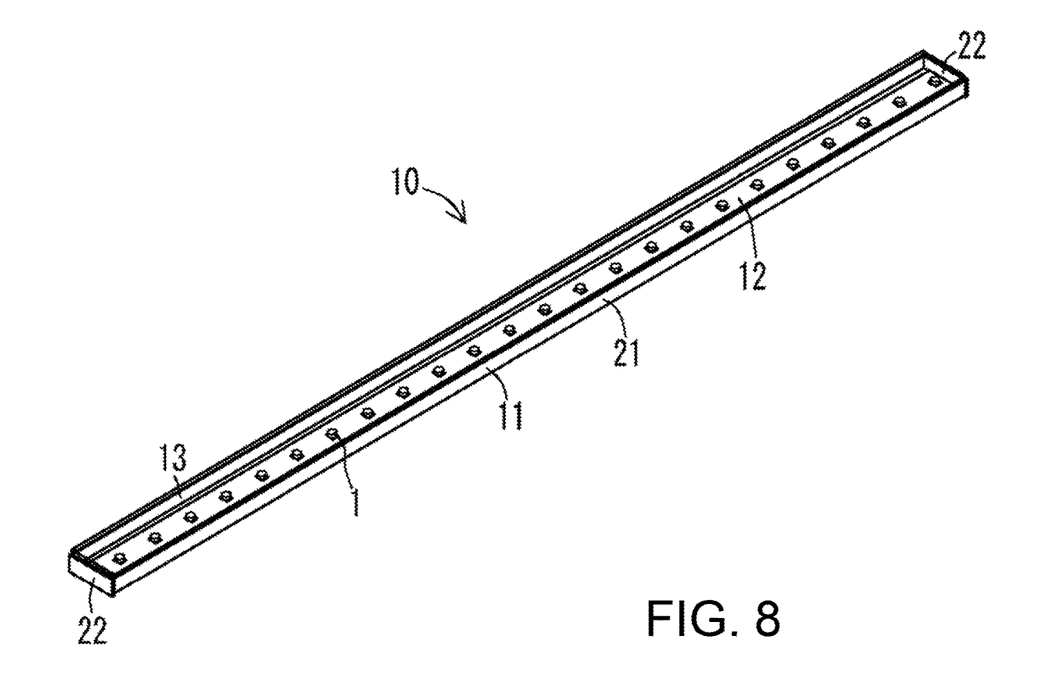
FIG. 8 is an external perspective view of an illumination apparatus including the light-emitting devices according to the embodiment of the present invention.
Figure 9:
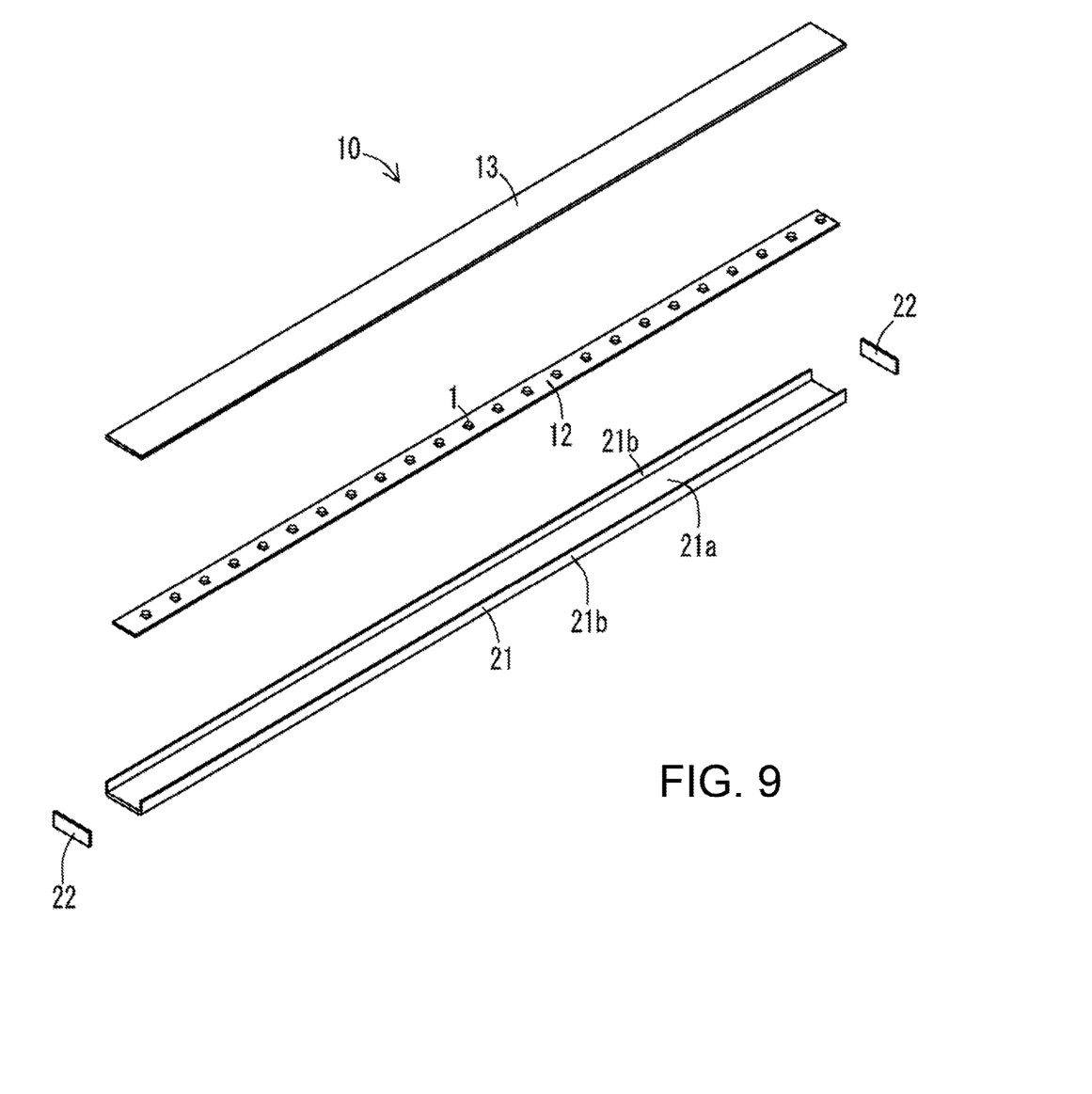
FIG. 9 is an exploded perspective view of the illumination apparatus according to the embodiment of the present invention.
Figure 10:
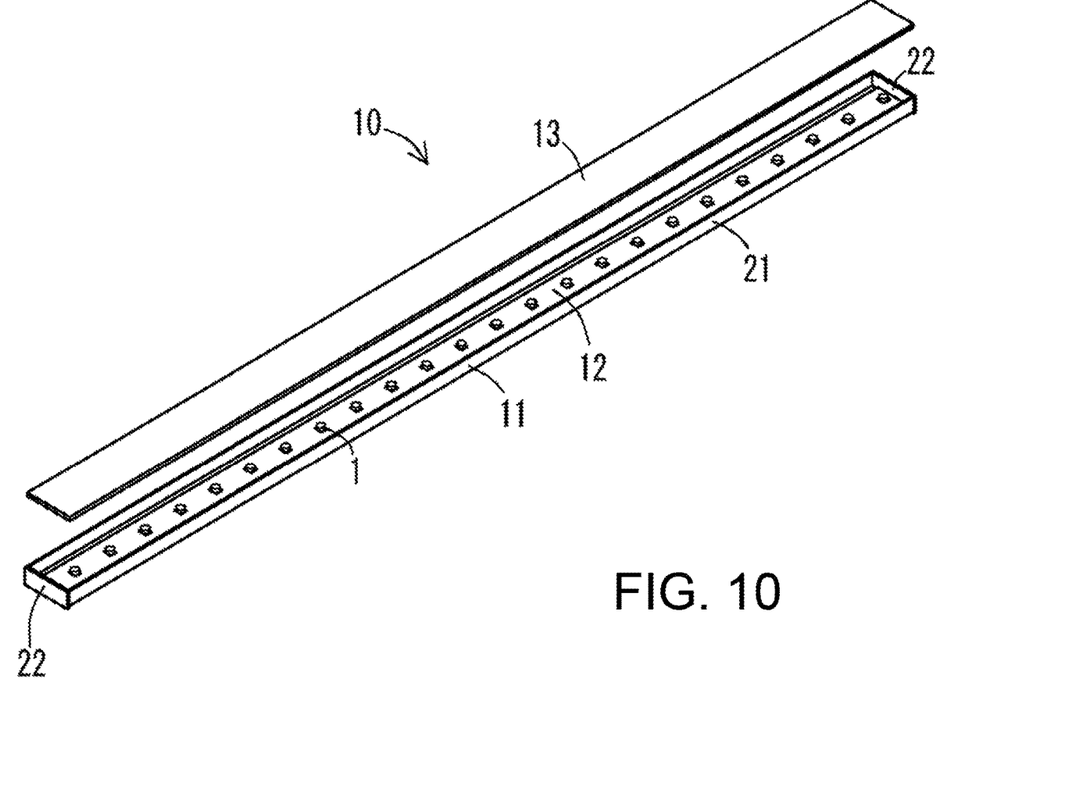
FIG. 10 is a perspective view of the illumination apparatus according to the present invention with a translucent substrate removed from a housing of the illumination apparatus.

FIG. 8 is an external perspective view of the illumination apparatus including the light-emitting devices according to the present embodiment. FIG. 9 is an exploded perspective view of the illumination apparatus shown in FIG. 8. FIG. 10 is a perspective view of the illumination apparatus shown in FIG. 8 with a translucent substrate removed from a housing of the illumination apparatus.

An illumination apparatus 10 includes an elongated housing 11 that is open upward, multiple light-emitting devices 1 that are arranged linearly in the longitudinal direction in the housing 11, an elongated wiring board 12 on which the light-emitting devices 1 are mounted, and an elongated translucent substrate 13 supported by the housing 11 and closing the opening of the housing 11.

The housing 11 supports the translucent substrate 13 and dissipates heat generated by the light-emitting devices 1 outside. The housing 11 is formed from, for example, metal such as aluminum, copper, or stainless steel, plastics, or a resin. The housing 11 has a bottom 21a extending in the longitudinal direction, a pair of supports 21b extending upright from the two ends of the bottom 21a in the width direction and extending in the longitudinal direction, an elongated body 21 that is open upward and open at two ends in the longitudinal direction, and two lids 22 for closing the open ends in the longitudinal direction of the body 21. The supports 21b each have, on the upper inner surface of the housing 11, holders including recesses facing each other to support the translucent substrate 13. The housing 11 has a length of, for example, 100 to 2000 mm inclusive, in the longitudinal direction.

The wiring board 12 is fixed on the bottom inside the housing 11. The wiring board 12 may be, for example, a printed board such as a rigid printed board, a flexible printed board, or a rigid flexible printed board. The wiring pattern on the wiring board 12 and the wiring pattern on the substrate 2 included in each light-emitting device 1 are electrically connected to each other with solder or conductive adhesive. A signal from the wiring board 12 is transmitted to the light emitter 3 through the substrate 2. The light emitter 3 then emits light. The wiring board 12 may be powered by an external power source through wiring.

The translucent substrate 13 is formed from a material that transmits light emitted from each light-emitting device 1. The translucent substrate 13 may be formed from, for example, a translucent material such as an acrylic resin or glass. The translucent substrate 13 is a rectangular plate, and has a length of, for example, 98 to 1998 mm inclusive in the longitudinal direction. The translucent substrate 13 is inserted through either of the two open ends of the main body 21 in the longitudinal direction along the recesses on the holders described above, is then slid in the longitudinal direction, and thus is supported by the pair of supports 21b at positions spaced from the multiple light-emitting devices 1. The open ends of the main body 21 in the longitudinal direction are then closed with the lids 22. This completes the illumination apparatus 10.

The illumination apparatus 10 described above is a line emission apparatus including the multiple light-emitting devices 1 arranged linearly. In some embodiments, the illumination apparatus 10 may be a plane emission apparatus including multiple light-emitting devices 1 arranged in a matrix or in a staggered pattern.

Although each light-emitting device 1 includes the five different phosphors in the single wavelength conversion member 6 as described above, or specifically the first phosphor 111 for emitting blue fluorescence, the second phosphor 112 for emitting blue-green fluorescence, the third phosphor 113 for emitting green fluorescence, the fourth phosphor 114 for emitting red fluorescence, and the fifth phosphor 115 for emitting fluorescence in the near-infrared region, each light-emitting device 1 may include two different wavelength conversion members. When the light-emitting device 1 includes two different wavelength conversion members, a first wavelength conversion member and a second wavelength conversion member may include different phosphors in a dispersed manner, or may include different combinations of phosphors in a dispersed manner. Light emitted through one wavelength conversion member may then be mixed with light emitted through the other wavelength conversion member. This facilitates the control of color rendering of the emitted light.

The light-emitting device 1 shown in FIGS. 1 to 3 was fabricated, and evaluated for its color rendering. The light emitter 3, which emits excitation light, is a gallium nitride light emitter that emits light with a peak wavelength of 405 nm and a half width of 15 nm. The light emitter 3 has the emission spectrum shown in FIG. 7. The spectra are measurable by, for example, spectroscopy using a spectrophotometer.

The first phosphor 111 is $(Sr, Ca, Ba)_{10}(PO_4)_6Cl_2:Eu$ with the fluorescence spectrum including the first peak wavelength $\lambda 1$ as shown in FIG. 4. The second phosphor 112 that shows blue-green is $Sr_4Al_{14}O_{25}:Eu$ with the fluorescence spectrum including the second peak wavelength $\lambda 2$ as shown in FIG. 4. The third phosphor 113 that shows green is $SrSi_2(O, Cl)_2N_2:Eu$ with the fluorescence spectrum including the third peak wavelength $\lambda 3$ as shown in FIG. 4. The fourth phosphor 114 that shows red is $CaAlSi(ON)_3:Eu$ with the fluorescence spectrum including the fourth peak wavelength $\lambda 4$ as shown in FIG. 4. The fifth phosphor 115 that shows fluorescence in the near-infrared region is $3Ga_5O_{12}:Cr$ with the fluorescence spectrum including the fifth peak wavelength $\lambda 5$ and the sixth peak wavelength $\lambda 6$ as shown in FIG. 5.

Figure 11:
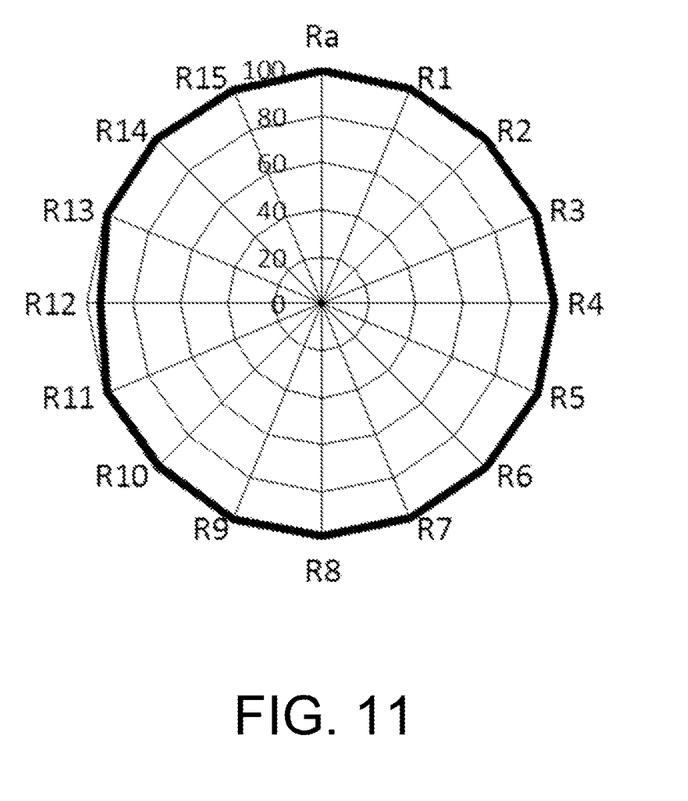
FIG. 11 is a graph showing color rendering produced by the light-emitting device according to one embodiment of the present invention.

The resultant light-emitting device 1 has the emission spectrum shown in FIG. 7. FIG. 11 shows color rendering produced by the light-emitting device 1 according to the embodiment of the present invention. The color rendering is evaluated with the color rendering evaluation method defined by JIS Z8726-1990. In this evaluation, the light-emitting device 1 in the present embodiment is used as a test light source, the chromaticity coordinates (x, y) are set to the coordinates (0.3443, 0.3558), and Commission Internationale de l'Éclairage (CIE) daylight is used as a reference illuminant.

The general color rendering index Ra (arithmetic average of R1 to R8) tends to be higher as the light is more similar to the spectrum of sunlight (with the highest value of 100). Thus, when the emission spectrum of the light-emitting device 1 as the test light source is more similar to the spectrum of sunlight, the index Ra is higher, indicating higher color rendering. The color rendering evaluation reveals that the index is 98% or greater for the light-emitting device 1 according to the embodiment of the present invention.

The light-emitting device 1 according to the embodiment of the present invention emits light with the emission spectrum shown in FIG. 7 and thus has color rendering shown in FIG. 11. The light-emitting device 1 thus has the emission spectrum similar to the spectrum of sunlight, achieving higher color rendering.

The present invention is not limited to the examples described in the above embodiments. All the embodiments according to the present invention may be variously modified, including numerical values. Various combinations of the features are not limited to the examples described in the above embodiments.

REFERENCE SIGNS LIST 1 light-emitting device
111 first phosphor
112 second phosphor
113 third phosphor
114 fourth phosphor
115 fifth phosphor
2 substrate
3 light emitter
4 frame
5 sealant
6 wavelength conversion member
10 illumination apparatus
11 housing
12 wiring board
13 translucent substrate
$\lambda 1$ first peak wavelength
$\lambda 2$ second peak wavelength
$\lambda 3$ third peak wavelength λ4 fourth peak wavelength
λ5 fifth peak wavelength
λ6 sixth peak wavelength
λ7 seventh peak wavelength
λ8 eighth peak wavelength
λ9 ninth peak wavelength
λ10 tenth peak wavelength
λ11 eleventh peak wavelength
λ12 twelfth peak wavelength
λ13 thirteenth peak wavelength

The invention claimed is:

1. A light-emitting device, comprising:
a wavelength conversion member including, in a dispersed manner, a first phosphor having a first peak wavelength in a wavelength region of 400 to 500 nm, a second phosphor having a second peak wavelength in a wavelength region of 450 to 550 nm, a third phosphor having a third peak wavelength in a wavelength region of 500 to 600 nm, a fourth phosphor having a fourth peak wavelength in a wavelength region of 600 to 700 nm, and a fifth phosphor having a fifth peak wavelength and a sixth peak wavelength in a wavelength region of 680 to 800 nm; and
a light emitter having a seventh peak wavelength in a wavelength region of 380 to 430 nm,
wherein the light-emitting device has an emission spectrum in a wavelength region of 380 to 950 nm including an eighth peak wavelength in a wavelength region of 380 to 430 nm, a ninth peak wavelength in a wavelength region of 430 to 480 nm, a tenth peak wavelength in a wavelength region of 480 to 550 nm, an eleventh peak wavelength in a wavelength region of 550 to 650 nm, a twelfth peak wavelength and a thirteenth peak wavelength in a wavelength region of 650 to 750 nm, and differences between relative light intensities at the peak wavelengths are less than 20%.

2. The light-emitting device according to claim 1, wherein a light intensity in the wavelength region of 380 to 430 nm constitutes 2 to 10% of a light intensity across the emission spectrum.

3. The light-emitting device according to claim 1, wherein a light intensity in a wavelength region of 620 to 850 nm constitutes 35 to 45% of a light intensity across the emission spectrum.

4. The light-emitting device according to claim 1, wherein differences between relative light intensities at the peak wavelengths in a wavelength region of 450 to 620 nm are 20% or less.

5. The light-emitting device according to claim 1, wherein a difference between a highest light intensity and a lowest light intensity is 50% or less in terms of relative light intensity in a wavelength region between the eighth peak wavelength and the ninth peak wavelength.

6. The light-emitting device according to claim 1, wherein the relative light intensity at the eighth peak wavelength is lower than a highest light intensity at the peak wavelength in other wavelength regions, and a difference between the relative light intensity at the eighth peak wavelength and the highest light intensity in the other wavelength regions is 30% or less in terms of relative light intensity.

7. An illumination apparatus, comprising:
a plurality of the light-emitting devices according to claim 1.

* * * * *